United States Patent
Lesso

(10) Patent No.: US 11,387,793 B2
(45) Date of Patent: Jul. 12, 2022

(54) AMPLIFIER CIRCUITRY

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/061,803

(22) Filed: Oct. 2, 2020

(65) Prior Publication Data

US 2021/0104984 A1   Apr. 8, 2021

Related U.S. Application Data

(60) Provisional application No. 62/910,592, filed on Oct. 4, 2019.

(30) Foreign Application Priority Data

Feb. 17, 2020 (GB) ..................................... 2002158

(51) Int. Cl.
  *H03F 3/217* (2006.01)
  *H03F 1/34* (2006.01)

(52) U.S. Cl.
  CPC ....... *H03F 3/217* (2013.01); *H03F 2200/129* (2013.01); *H03F 2200/165* (2013.01)

(58) Field of Classification Search
  CPC ............... H03F 3/217; H03F 2200/129; H03F 2200/165; H03F 2200/03; H03F 1/3223;

(Continued)

(56) References Cited

U.S. PATENT DOCUMENTS 8,237,496 B2 * 8/2012 Jiang ...................... H03F 3/217
                                                            330/10
9,628,040 B2 * 4/2017 Lesso ..................... H03G 7/007
(Continued)

FOREIGN PATENT DOCUMENTS

GB            2563094 A        12/2018

OTHER PUBLICATIONS

Combined Search and Examination Report under Sections 17 and 18(3), UKIPO, Application No. GB2002158.0, dated Jul. 27, 2020.

*Primary Examiner* — Hieu P Nguyen
(74) *Attorney, Agent, or Firm* — Jackson Walker L.L.P.

(57) ABSTRACT

This application relates to amplifier circuitry, in particular class-D amplifiers, operable in open-loop and closed-loop modes. An amplifier (300) has a forward signal path for receiving an input signal ($S_{IN}$) and outputting an output signal ($S_{OUT}$) and a feedback path operable to provide a feedback signal ($S_{FB}$) from the output. A feedforward path provide a feedforward signal ($S_{FF}$) from the input and a combiner (105) is operable to determine an error signal ($\varepsilon$) based on a difference between the feedback signal and the feedforward signal. The feedforward comprises a compensation module (201) configured to apply a controlled transfer function to the feedforward signal in the closed-loop mode of operation, such that an overall transfer function for the amplifier is substantially the same in the closed-loop mode of operation and the open-loop mode of operation.

18 Claims, 4 Drawing Sheets

(58) Field of Classification Search
CPC .......... H03F 3/183; H03F 1/26; H03F 3/2173; H03F 3/2175
USPC ...................................... 330/10, 207 A, 251
See application file for complete search history.

(56) References Cited

U.S. PATENT DOCUMENTS

| | | |
|---|---|---|
| 2014/0266457 A1 | 9/2014 | Scott et al. |
| 2016/0118948 A1 | 4/2016 | Zanbaghi |
| 2019/0115886 A1 | 4/2019 | Das et al. |

* cited by examiner

AMPLIFIER CIRCUITRY

TECHNICAL FIELD

The field of representative embodiments of this disclosure relates to methods, apparatus and/or implementations concerning or relating to amplifier circuitry, and in particular to class-D amplifiers and methods of operation thereof.

BACKGROUND

Many electronic devices include amplifier circuitry, for instance for amplifying an input signal to provide a driving signal to drive a transducer, which could be an audio transducer, such as a speaker, whether of the host device or some accessory which is removably connected to the host device, or some other transducer, e.g. a linear resonant actuator for generating haptic feedback.

As mixed-signal design moves to deep sub-micron nodes, which are selected to enable digital processing features and minimize area, conventional analogue circuits do not scale well. Analogue amplifier components can thus have a large impact on the area and power of the circuitry. Digital circuitry scales with process node, making a digital Class D architecture attractive and allowing the design to benefit from the programmability and adaptability of a digital implementation. A class-D amplifier with a digital modulator can thus be advantageously used in a variety of applications.

A standard digital modulator has a well-defined transfer function, for instance flat and with a defined gain over some pass-band range of frequency. Ideally this digital-domain signal processing gives high performance and avoids analogue circuitry with its non-zero signal degradation associated with noise, component mismatch and non-linearity. However, the performance of a class-D amplifier may be limited by analogue effects in an output driver stage of the amplifier. For example, output driver transistor on-resistance, finite rise and fall times, propagation delays and output impedance may impact performance. In addition, any power supply ripple will cause a proportional gain variation of the output driver stage, leading to added noise in the output.

Feedback techniques may be used to suppress signal distortion arising from these causes. A class-D amplifier may thus have a feedback path for providing feedback from the output of the amplifier. The feedback signal may be subtracted from the input signal to provide an error signal, which may be filtered, and the filtered error signal combined with the input signal upstream of the digital modulator to compensate for the downstream distortion. To allow for digital processing of the feedback and error signals, the feedback path comprises an analogue-to-digital converter (ADC). The performance of such an amplifier circuit can be limited by the noise, resolution and linearity of the ADC.

In some implementations, to optimize the performance across the input signal range, a digital Class-D amplifier can be designed to operable in both open-loop and closed-loop modes, dynamically switching between the modes of operation depending on the output signal amplitude. An example of such an amplifier design arranged to switch between open- and closed-loop modes based on the signal magnitude can be seen in U.S. Pat. No. 9,628,040.

SUMMARY

Embodiments of the present disclosure relate to methods, apparatus and systems for amplifier circuitry, for instance class-D amplifier circuitry, that are selectively operable in open- and closed-loop modes.

According to an aspect of the disclosure there is provided amplifier circuitry comprising:
- a forward signal path for receiving an input signal and outputting an output signal;
- a feedback path operable to provide a feedback signal derived from the output signal;
- a feedforward path operable to provide a feedforward signal derived from the input signal; and
- a combiner operable to determine an error signal based on a difference between the feedback signal and the feedforward signal;
- wherein the amplifier circuit is selectively operable in a closed-loop mode of operation in which the input signal in the forward signal path is combined with a signal derived from said error signal and an open-loop mode of operation in which the input signal in the forward signal path is not combined with a signal derived from said error signal; and
- wherein the feedforward path comprises a compensation module configured to apply a controlled transfer function to the feedforward signal in the closed-loop mode of operation such that an overall transfer function for the amplifier circuit is substantially the same in the closed-loop mode of operation and the open-loop mode of operation.

The compensation module may comprise a filter having a controlled transfer function.

In some implementations the compensation module may be an adaptive module, for example an adaptive filter. The compensation module may be configured to monitor the error signal and to adapt its transfer function in response to the error signal, so that the error signal exhibits a desired characteristic over a signal band of interest.

In some implementations the compensation module may be configured to have a transfer function which is matched to a transfer function for the feedback path.

The amplifier circuitry may include a controller for selectively controlling the amplifier circuit in the open-loop mode of operation or the closed-loop mode of operation. The controller may be configured to selectively transition between the open-loop mode of operation and the closed-loop mode of operation based on an indication of amplitude of the input signal.

In some examples, the controller may be configured to selectively control a loop gain factor, wherein the loop gain factor is equal to zero in the open-loop mode of operation and equal to one in the closed-loop mode of operation. The amplifier circuit may also be operable in at least one additional mode of operation where the loop gain factor is equal to a non-zero value less than one.

In some examples the controller may be configured to control the loop gain factor based on an indication of power supply noise. In some examples the controller may be configured to control the loop gain factor based on the error signal.

In some examples the controller may be configured to control a bias applied to a component in the feedback path to have a first level in the closed loop mode of operation and a second, lower, level in said additional mode of operation.

The amplifier circuitry may be a class-D amplifier circuit. The amplifier circuitry may have a class-D modulator and a class-D output stage in the forward signal path.

In some implementations there may be a feedback filter in the feedback path. The feedback filter may, in some examples, be a low-pass filter.

The amplifier circuitry may include a loop-filter in an error path for the error signal.

The amplifier circuitry may be implemented as an integrated circuit.

An aspect also relates to an electronic device comprising amplifier circuitry as described in any of the variants herein.

In another aspect there is provided a class-D amplifier circuit for receiving an input signal and outputting an output signal, the class-D amplifier circuit comprising a digital modulator and an output stage, wherein the class D amplifier is selectively operable in:

an open loop mode of operation wherein the input signal as received is provided as an input to the modulator; and a closed-loop mode of operation in which the input signal is modified based on an error signal before being provided as an input to the modulator, wherein the error signal is determined based on a difference between a feedback signal derived from the output signal and a feedforward signal derived from the input signal; and the class-D amplifier circuit further comprises a compensation module, the compensation module having a transfer function controlled such that an overall transfer function for the class-D amplifier circuit in the closed-loop mode of operation is substantially the same as in the open-loop mode of operation.

In a further aspect there is provided a class-D amplifier circuit comprising:

a forward signal path for receiving an input signal and outputting an output signal;

a feedback path for providing a feedback signal derived from the output signal;

a feedforward path for providing a feedforward signal derived from the input signal;

an error path for generating an error signal based on the difference between the feedback signal and the feedforward signal and modifying the input signal in the forward signal path based on the error signal; and a compensation module in the feedforward signal path having a controlled transfer function so as to amply a compensation to the error signal to compensate for a transfer function of the feedback path.

In a further aspect, there is provided amplifier circuitry comprising:

a forward signal path for receiving an input signal and outputting an output signal;

a feedback path operable to provide a feedback signal derived from the output signal;

a feedforward path operable to provide a feedforward signal derived from the input signal; and a combiner operable to determine an error signal based on a difference between the feedback signal and the feedforward signal;

wherein the amplifier circuit is selectively operable to vary a loop gain factor so as to vary an extent to which the error signal contributes to the forward signal path;

wherein the feedforward path comprises a compensation module configured to apply a controlled transfer function to the feedforward signal such that an overall transfer function for the amplifier circuit is substantially for different values of the loop gain factor.

The amplifier circuit may be operable in full closed-loop mode with the loop gain factor equal to one. The amplifier circuit may be operable in a partial closed-loop mode with the loop gain factor between one and zero. The amplifier circuit may be operable in an open-loop mode with the loop gain factor equal to zero.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments relate to amplifier circuitry and to methods of operation thereof that is selectively operable in a closed-loop mode of operation.

Figure 1:
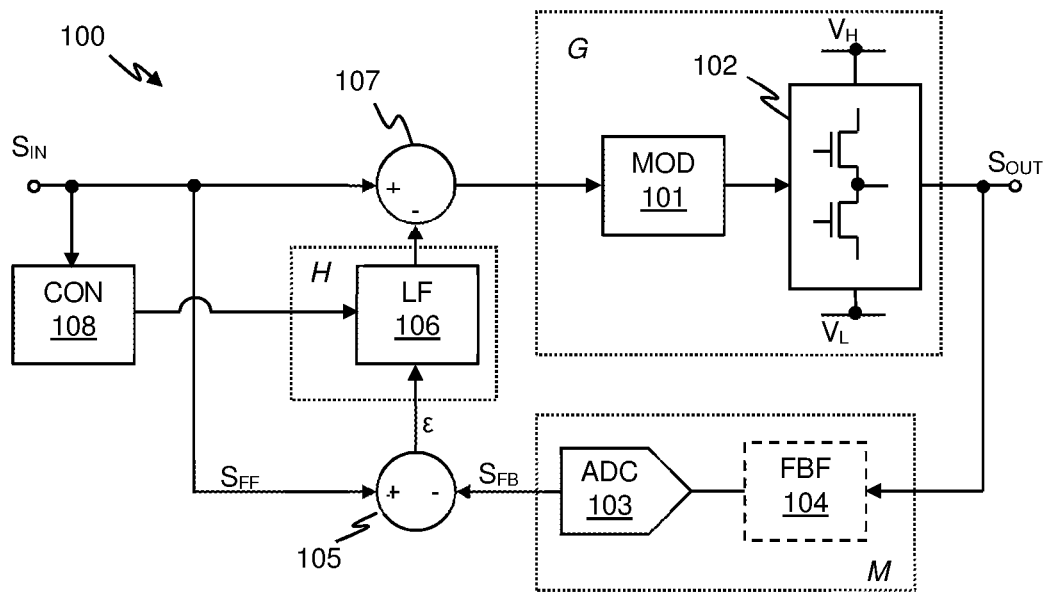
FIG. 1 illustrates an example of a class-D amplifier circuit.

FIG. 1 illustrates one example of a general class-D amplifier circuit 100. The amplifier circuit 100 receives an input signal $S_{IN}$, which will typically be an input digital signal, and outputs an output signal $S_{OUT}$ which may be a driving voltage. A forward signal path thus extends from an input node to an output node. This forward signal path includes a digital modulator 101, for instance a PWM modulator, upstream of an output stage 102. The digital modulator 101 receives a signal derived from the input signal and generates a suitable modulator output to control switches of the output stage 102. The output stage 102 may be implemented with a half-bridge configuration so as to switch between two different output states, e.g. a 'High' state (e.g. a +1 state) with the output connected to a high voltage $V_H$ or a "Low" state (e.g. a −1 state) with the output connected to a low voltage $V_L$. In some instances, however, the output stage could be implemented as a full-bridge arrangement, with two outputs that can be selectively switched to provide a positive voltage differential (e.g. a +1 state with a first output connected to the high voltage $V_H$ and the second output connected to the low voltage $V_L$) or a negative voltage differential (e.g. a −1 state with the first output connected to the low voltage $V_L$ and the second output connected to the high voltage $V_H$). Additionally, some implementations may support an additional state with no voltage differential (e.g. a zero state with both outputs connected to the same voltage $V_H$ or $V_L$). In such a case the modulator 101 may be a suitable modulator for driving a full-bridge output. Note as used herein the terms "high" and "low" used in the context of a voltage for the output stage as used in a relatively sense to distinguish between the two voltages and these terms do not imply any particular absolute voltage level. In some instance in some implementations the high voltage could be a non-zero voltage of some magnitude and the low voltage could be ground, in other implementations the high and low voltages could be of equal magnitude but opposite polarity.

The amplifier circuit 100 is operable in a closed-loop mode of operation and thus includes a feedback path for providing a feedback signal $S_{FB}$ derived from the output signal $S_{OUT}$. The feedback path includes an analogue-to-digital converter (ADC) 103. In some instances the feedback path may include a feedback path filter 104. The feedback path filter may be implemented in the analogue part of the feedback path (as illustrated) or in the digital part of the feedback path.

In the example of FIG. 1 the feedback signal is subtracted from a version of the input signal $S_{IN}$ (or vice-versa) to provide an error signal ε. In the example of FIG. 1 the feedback signal $S_{FB}$ is combined with a feedforward signal $S_{FF}$ of the input signal by combiner 105 to provide the error signal ε. Thus a feedforward path extends from a node of the main forward signal path to the combiner 105.

The error signal ε is filtered by a loop filter 106 and, in closed-loop operation, the filtered error signal is combined with the input signal $S_{IN}$ upstream of the modulator 101 by combiner 107. An error signal path thus extends between the combiner 105 and the combiner 107 which includes the loop filter 106.

The action of the feedback loop can help to suppress any distortions arising from analogue effects in the output stage 102 and/or any variation in the voltages $V_H$ and/or $V_L$. However, as mentioned above, the performance of the ADC 103, for example the noise characteristics, also has an impact on the performance of the amplifier. In addition, the ADC 103 and other components of the feedback path add to the power consumption of the amplifier circuit 100 and generally there is a desire for low power consumption.

The amplifier circuit 100 may thus be selectively operable in a closed-loop mode of operation and also an open-loop mode of operation. The amplifier circuit may, for example, be operated in a closed-loop mode of operation at relatively high signal amplitudes. At relatively high signal amplitudes, the effect of any distortion could be relatively significant, but the noise floor of the amplifier is less of a concern due to the high signal amplitudes. It can therefore be beneficial to operate in the closed-loop mode. At relatively lower signal amplitudes the amplifier circuit may be operable in an open-loop mode of operation. At relatively low signal amplitudes the impact of any output stage distortion may be relatively low, however for these lower signal amplitudes the noise floor of the amplifier is of greater concern. Therefore at low signal amplitudes it may be beneficial to operate in an open-loop mode so as to avoid any noise contribution from the ADC 103. Such operation may allow the design tolerances for the ADC 103 to be more relaxed than would be the case if the amplifier always operated in a closed-loop mode, without a degradation in performance at lower signal amplitudes, which can allow the ADC to be smaller in area and/or consume less power. Such operation may also provide better performance at higher signal amplitudes than would be the case if the amplifier were always operated in an open-loop mode.

The amplifier circuit 100 therefore includes a controller 108 for controlling the amplifier circuit. In the example of FIG. 1 the controller monitors the input signal $S_{IN}$ and, based on the input signal, selectively controls the amplifier circuit 100 in an open-loop mode of operation or a closed-loop mode of operation. For example, as illustrated in FIG. 1, the controller 108 may monitor the input signal $S_{IN}$ to determine an indication of amplitude and may control an effective gain of the loop filter 106, i.e. a gain of the transfer function H of the loop filter 106. In the closed-loop mode of operation the gain of the loop filter may be set to a predetermined non-zero value, e.g. H=$H_C$. The amplifier circuit 100 thus operates as described above and combined the filtered error signal with the input signal $S_{IN}$. In the open-loop mode of operation the gain of the loop filter may be set to zero, e.g. H=0. In this case there is effectively no contribution from the filtered error signal to the input signal, and the input to the modulator 101 is simply the input signal. The controller may thus monitor the input signal $S_{IN}$ against one or more thresholds and selectively control the gain from the feedback, e.g. to switch between the closed-loop and open-loop modes of operation based on an indication of signal amplitude.

It will be understood the controller could control the amplifier circuit to transition between open- and closed-loop modes of operation in other ways. For instance if an indication of signal amplitude is available, e.g. from upstream module, the controller 108 could receive such an indication. The effective gain of the loop-filter 106 could be controlled by varying some components of the loop filter, or by controlling some digital gain element (not separately illustrated) in the error path. Alternatively the combiner 107 for combining the filtered error signal with the input signal $S_{IN}$ could be a selective combiner which could be controlled to vary the extent to which the filtered error signal is combined with the input signal.

In operation the amplifier circuit 100 may thus vary the effective loop gain to transition between the open- and closed-loop modes of operation.

The operation of the modulator 101 and output stage 102 collectively provides a transfer function G in the main forward signal path. The ADC 103 and filter 104 if present collectively provide a transfer function M in the feedback path. The loop filter applies a transfer function H in the error path. If the input signal is represented by X and the output signal is represented by Y, the system transfer function (STF) will, in the closed-loop mode of operation, be given by:

$$\frac{Y}{X} = \frac{G - GH}{1 - GHM} \qquad \text{Eqn. (1)}$$

As noted above, the transfer function of the digital gain modulator 101 may be substantially flat over the signal band of interest and typically the modulator applies no gain. The output stage 102 replicates the modulator output and thus, for many class-D amplifiers, the transfer function G in the main forward signal path may be substantially equal to unity. In which case the STF of the loop may become:

$$\frac{Y}{X} = \frac{1 - H}{1 - HM} \qquad \text{Eqn. (2)}$$

Typically the value of H may be relatively high, to provide suitable closed-loop operation. In which case the STF, for closed loop operation, can be approximated to:

$$\frac{Y}{X} \approx \frac{1}{M} \qquad \text{Eqn. (3)}$$

Thus the STF for the amplifier circuit 100 can be approximated to 1/M in the closed-loop mode of operation.

The transfer function M of the feedback path may, in at least some amplifier designs, not be simply unity over the signal band of interest in order to provide desired operation in the closed-loop mode of operation. For example, in at least some designs filter 104 may be present in the feedback path and configured as a low-pass filter, to provide suppression of the PWM carrier and any other high frequency signals and transients at the output, to avoid them being mixed down to audio frequencies by imperfections of the ADC.

Figure 2:
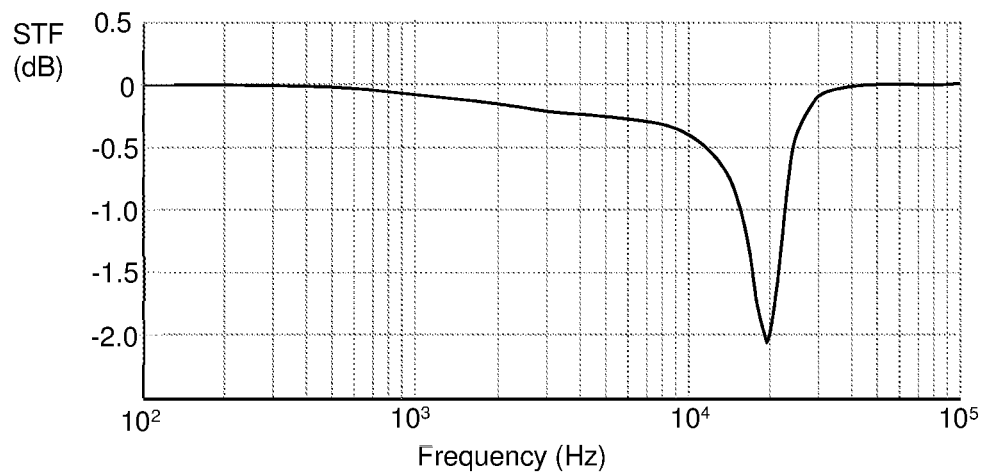
FIG. 2 illustrates an example system transfer function for the circuit of FIG. 1.

FIG. 2 illustrates an example of the STF for an amplifier circuit 100 such as illustrated in the FIG. 1 operating in closed-loop mode, in which the transfer function M of the feedback path is that of a second-order low-pass filter. It can be seen that the STF is not flat over the signal band of interest, which in this example may be a band for audio signals.

In the open-loop mode of operation however, there is no contribution from the error path, and hence also no contribution from the feedback path, and thus the STF depends on the transfer function G of the main forward signal path. As noted above, the transfer function G for the main forward signal path may be effectively unity, for the signal band of interest.

In this case, the STF for the amplifier circuit 100 will change as a result of a variable gain applied to the feedback, i.e. a loop gain, for instance to transition between the open-loop mode of operation and the closed-loop mode of operation. Such a change in STF may result in artefacts in the output signal, e.g. for an audio signal the transition between modes may result in audible artefacts such as pops or clicks which are undesirable.

Embodiments of the disclosure thus relates to amplifier circuits and to methods of operation thereof that at least mitigate the problems of varying the loop gain, e.g. for transitioning between open- and closed-loop modes of operation.

Figure 3:
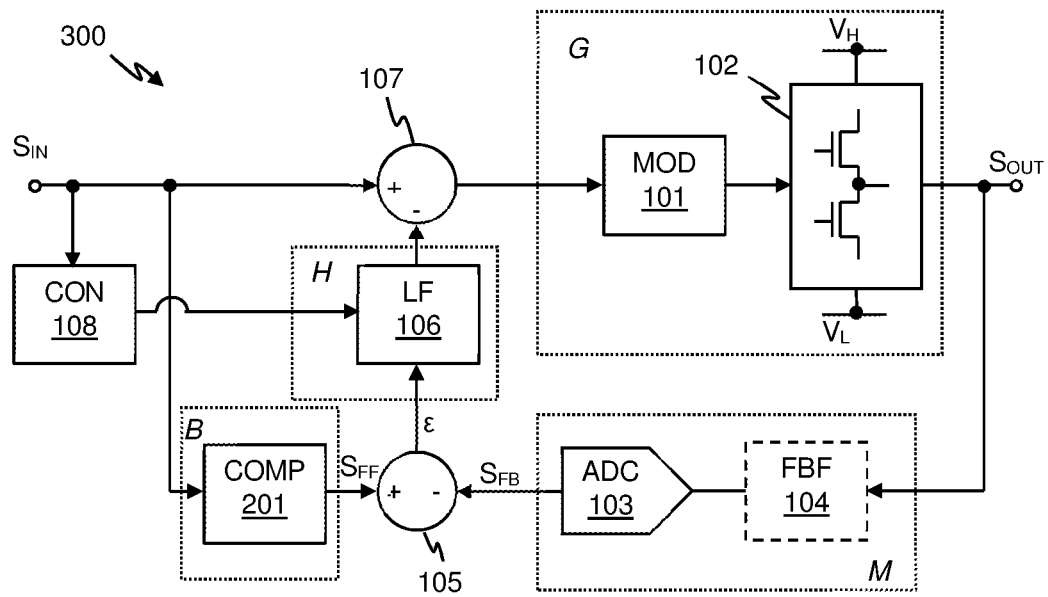
FIG. 3 illustrates an example of amplifier circuit according to an embodiment.

FIG. 3 illustrates an amplifier circuit 300 according to an embodiment, in which similar components to those described above with reference to FIG. 1 are identified by the same numerals.

The amplifier circuit 300 again has a forward signal path between an input for receiving an input signal $S_{IN}$ and an output for outputting an output signal $S_{OUT}$, where the main forward signal path includes a modulator 101 and an output stage 102 and has a transfer function G. As discussed in relation to FIG. 1 a feedback path, including an ADC 103 and possibly other components such as a feedback filter 104, collectively with a transfer function M, provides a feedback signal to combiner 105. The combiner 105 is operable to generate an error signal ε based on the difference between the feedback signal $S_{FB}$ and a feedforward signal $S_{FF}$ derived from the input signal $S_{IN}$. An error path for the error signal ε includes loop filter 106. Combiner 107 is operable to combine the filtered error signal with the input signal $S_{IN}$ upstream of the modulator in a closed-loop mode of operation.

The amplifier circuit 300 also includes a compensation module 201, for instance a filter, which compensates for the transfer function M of the feedback path. In the amplifier circuit 300 illustrated in FIG. 3 the compensation module is located in the feedforward path so as to apply a transfer function B to the tapped version of the input signal $S_{IN}$ to provide the feedforward signal $S_{FF}$.

The system transfer function (STF) for the amplifier circuit 300, in closed-loop operation, will be given by:

$$\frac{Y}{X} = \frac{G - GHB}{1 - GHM} \qquad \text{Eqn. (4)}$$

Again the transfer function G of the main forward signal path may be substantially equal to unity across the signal band of interest. In this case, the closed-loop STF can be seen as:

$$\frac{Y}{X} = \frac{1 - HB}{1 - HM} \qquad \text{Eqn. (5)}$$

In this case, if the transfer function B of the compensation module, e.g. filter, 201 is matched to that of the feedback path, the STF for closed loop operation will also be equal to unity across the signal band. Thus the STF for the amplifier will be substantially the same in both the open- and closed-loop modes of operation and any variation in loop gain, e.g. the gain applied to the error signal, will not alter the STF of the amplifier circuit 300.

Figure 4:
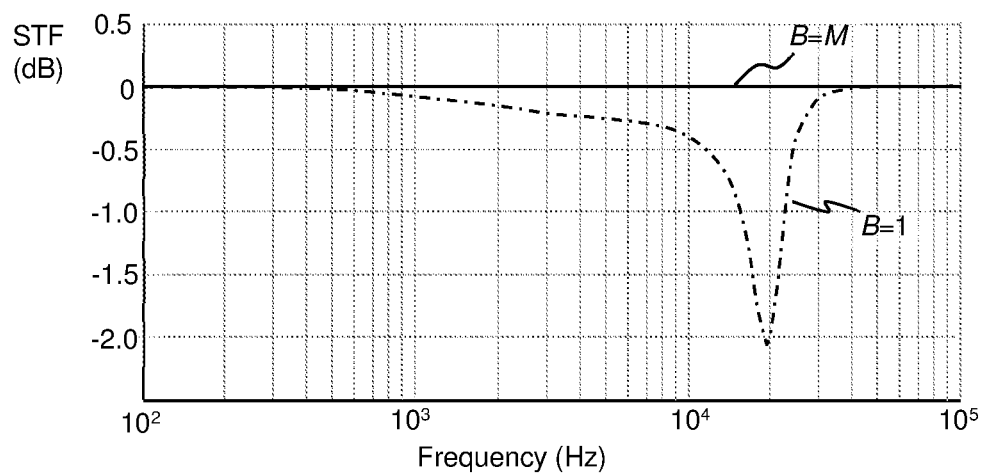
FIG. 4 illustrates an example system transfer function for the circuit of FIG. 1.

FIG. 4 illustrates an example of the STF for an amplifier circuit 300 such as illustrated in the FIG. 3 operating in closed-loop mode, in which the transfer function M of the feedback path is that of a second-order low-pass filter. FIG. 4 shows, in the dotted line, the STF if the transfer function B of the compensation module 201 were unity, i.e. with no compensation applied and, in the solid line, where the transfer function B of the compensation module 201 is matched to that M of the feedback path, i.e. with compensation applied. It can be seen that with the appropriate compensation applied, the STF is flat over the signal band of interest, which in this example may be a band for audio signals. The STF for the amplifier circuit 300, with appropriate compensation applied, is thus the same in both the open- and closed-loop modes of operation. Therefore transitioning between the modes of operation results in no significant change in the STF for the amplifier circuit and hence the possibility of any artefacts, such as audible pops or clicks in an audio signal, is thus significantly reduced or even eliminated.

In some implementations the compensation module 210 may have a predefined transfer function B which may be defined with respect to transfer function M of the relevant components of feedback path, e.g. the filter 104 and ADC 103 as appropriate.

The transfer function M of the relevant components of the feedback path may be determined in any number of ways. The transfer function M could be determined by calculation or simulation based on the known design of the amplifier circuit, and/or the transfer function could be measured in a calibration step during device fabrication. The compensation module 201 may, as discussed, comprise a digital filter. The digital filter may be designed to have a desired transfer function in any of a number of know ways, for instance the compensation module may implement a function based on a polynomial and the coefficients of the polynomial may be defined to provide the desired transfer function.

Figure 5:
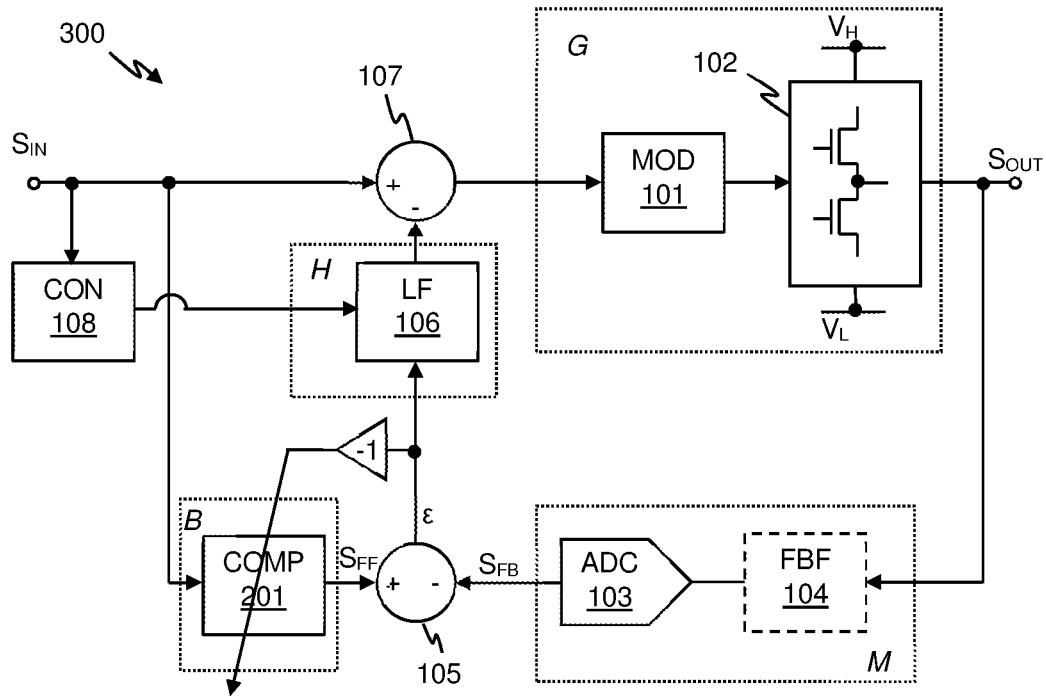
FIG. 5 illustrates a further example of amplifier circuit according to an embodiment.

In some instances the compensation module 201 may comprise a filter with a predefined response. In some embodiments, however, the compensation module may comprise an adaptive filter which is configured to track the error signal with a slow time constant. FIG. 5 illustrates an example where the compensation module is adaptive, e.g. comprises an adaptive filter, and is configured to track the error signal.

In this case the adaptive filter of the compensation module 201 is configured to adapt the transfer function B applied so that the error signal ε, over time, has a desired characteristic, e.g. is flat over the signal band of interest. This adaption will effectively correct for any effects of the feedback path and thus will mean that the overall STF for the amplifier circuit 300 in the closed loop mode of operation is effectively flat and matched to the STF in the open-loop mode of operation.

FIG. 5 illustrates that the adaptive compensation module may track the error signal ε before filtering, but any error node, i.e. a node that varies with the error signal could be monitored, which could be a node of the error path after the loop filter or possibly a node of the forward signal path.

In operation the controller 108 may thus operate to vary the mode of operation between the closed-loop mode of operation and the open-loop mode of operation according to operating conditions, for instance the signal amplitude of the input signal $S_{IN}$ as discussed above. Because the STF of the amplifier circuit does not substantially vary between these operating modes, the controller 108 may be able to transition between modes more quickly, or with less fading (e.g. intermediate gains being applied by loop filter 106 or a digital gain element in the error path) than otherwise would be the case. It should be understood however that the principles described herein apply to any switch in modes for any reason, and the controller 108 may additionally or alternatively be configured to selectively control the amplifier circuit to operate in the closed-loop mode or the open-loop mode for any reason.

The examples above have described that the compensation module 201 is part of the feedforward path. In theory if only a gain correction were needed, the compensation could be applied to the feedback path in the digital domain after the ADC, but in practice there may be a need to match delay etc. and thus the compensation is advantageously applied in the feedforward path.

Figure 6:
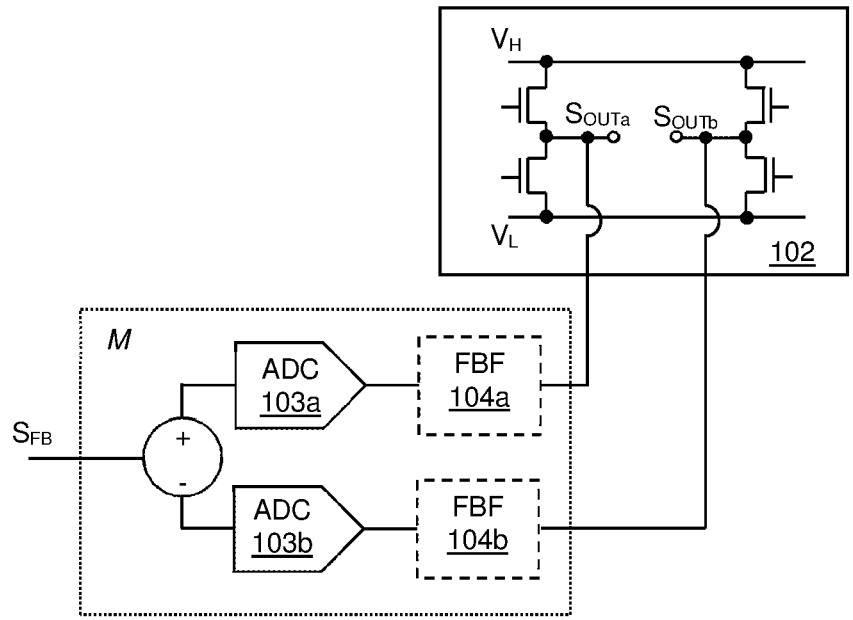
FIG. 6 illustrates feedback with a full bridge output stage.

The examples above have been described with reference to a single output signal for ease. As noted above however in some implementations the output stage 102 could be implemented as a full-bridge, e.g. to drive a load as a bridge-tied load. The same principles apply. In such a case the feedback signal is derived from the voltage difference across the outputs. For example, FIG. 6 illustrates just selected components of an amplifier circuit with an output stage 102 that comprise a full bridge for outputting an output signal to a bridge-tied load (not illustrated). In this case the output signal comprises components $S_{OUTa}$ and $S_{OUTb}$ which are applied to either side of the load. The feedback signal $S_{FB}$ may be determined by monitoring each output signal component, for instance by separately converting each output signal components to digital via a respective ADC 103a and 103b, possibly after filtering by a respective filter 104a or 104b. The difference between the two digital signals output from the ADCs 103a and 103b may provide the feedback signal. In this case the relevant transfer function M of the feedback path is the transfer function between the output signal $S_{OUTa} - S_{OUTb}$ and the feedback signal $S_{FB}$.

The description above has focussed on the amplifier circuit 300 transitioning between a closed-loop mode of operation and an open-loop mode of operation. In effect, a loop gain factor, which controls the extent to which any feedback is applied to the forward signal path may be varied between 1 in the closed-loop mode of operation and 0 in open-loop mode of operation. In the examples above, where gain may be varied in the error path for the error signal ε, the error path may be controlled to have a transfer function equivalent to $\alpha H_{Max}$, where α is the loop gain factor that is 0 in the open-loop mode and 1 in the closed-loop mode and $H_{Max}$ is a maximum of the transfer function of the error path.

In some implementations the amplifier circuit 300 may be operable in a mode in which the loop gain factor α is controlled, in use, to an intermediate value between 1 and 0, and not just as part of a gradual transition between open-loop and closed-loop modes of operation. As noted above, applying the appropriate transfer function B to the feedforward signal $S_{FF}$ means that the STF for the amplifier circuit does not substantially with the loop gain, and thus the loop gain factor may be varied to any intermediate value between 0 and 1 without any substantial impact on the STF of the amplifier circuit. Varying the loop gain factor does, however, vary the noise transfer characteristic and may allow benefits in noise performance and/or power consumption.

The amplifier circuit 300 may, for instance, be operable in a first mode with the loop gain factor α equal to 1, which may be regarded as a 'full' closed-loop mode of operation. In another mode of operation, the loop gain factor α may be controlled to some non-zero value less than 1. This mode of operation, may be regarded as a 'partial' closed-loop mode where there is still some feedback to the forward signal path, but the contribution of the feedback is reduced compared to the full closed-loop mode. The amplifier circuit may be operable in a partial closed-loop mode in addition to, or as an alternative to, operation in an open-loop mode with the loop gain factor α set to zero.

As discussed above, operating in the full closed-loop mode of operation may be advantageous to suppress analogue distortion or THD in the output stage and/or noise such as power supply noise but, for some operating conditions these issues may be less of a concern. As discussed, distortion is more of a concern at higher signal levels and, as for class-D amplifiers PSSR is multiplicative (rather than additive as is the case for linear amplifiers), power supply noise is also less of a concern at lower signal levels. For some operating conditions, e.g. at lower signal levels, the benefits of full closed-loop operation may be offset by the noise and/or power consumption of the components of the feedback path, e.g. the ADC 103. Switching to an open-loop mode of operation for certain operating conditions, such as when amplifying relatively low-level signals, can provide benefits in power consumption and/or noise performance. Operating in a partial closed-loop mode of operation may allow further benefits in noise performance and/or power consumption compared to just operating in a full closed-loop mode or an open-loop mode.

The controller 108 of the amplifier circuit 300 may thus be operable to control a loop gain factor α applied to provide a partial closed-loop mode of operation.

Figure 7:
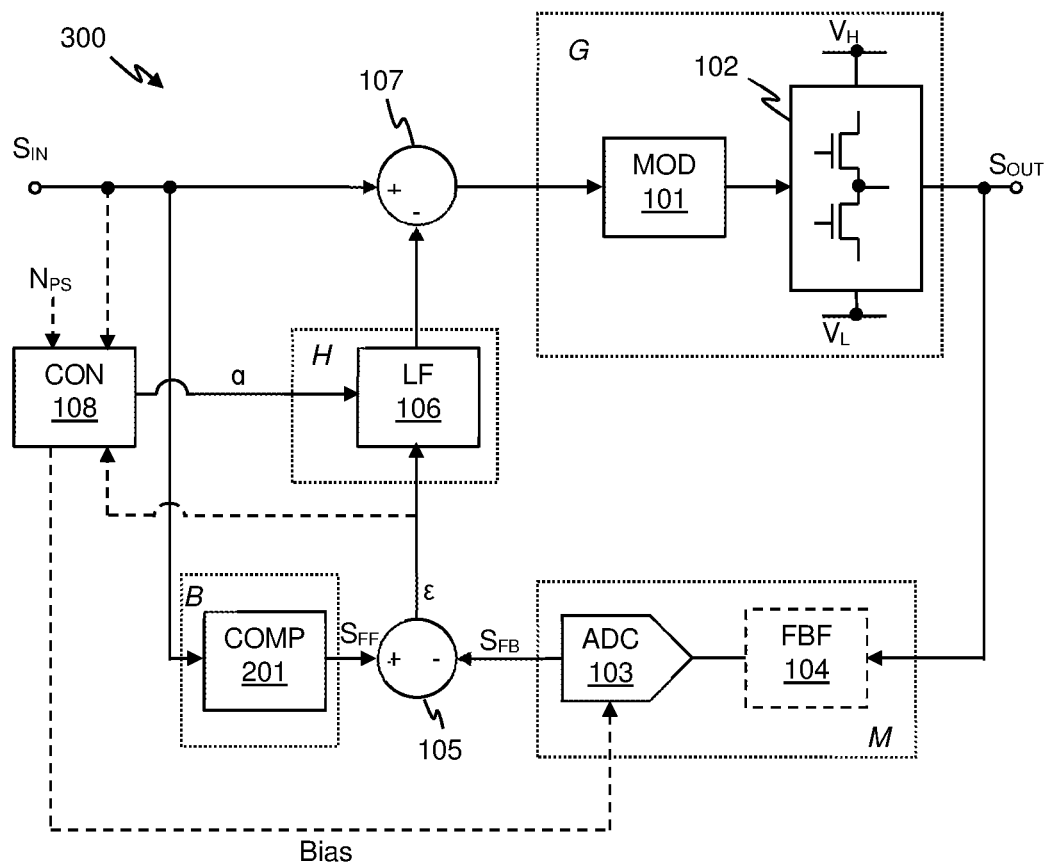
FIG. 7 illustrates a further example of an amplifier circuit.

FIG. 7 illustrates an example of an amplifier circuit 300, similar to that illustrated in FIG. 3, which shows that the controller 108 may be configured to control the loop gain factor α, in this example a loop gain applied to the path for the error signal ε. As discussed above, the gain may be controlled by varying the gain of the loop filter 106 itself and/or a gain element in the error path (not separately illustrated), although other implementations are possible.

In some implementations the loop gain factor may be variable between a range of different possible intermediate values, i.e. the amplifier circuit may be operable with the loop gain factor α equal to a number of different values between 0 and 1. The controller 108 may be operable to selectively vary, in use, the loop gain factor based on the input signal and may selectively vary the loop gain factor between different values in a continuous or stepwise manner.

Reducing the loop gain will reduce the extent to which any noise from the ADC 103 and/or other components of the feedback path contribute to the forward signal path, but maintaining the loop gain above zero, i.e. providing some feedback, allows for suppression of THD and power supply noise. Operating in a partial closed-loop mode can thus allow a trade off between power supply noise/THD and noise arising from the components of the feedback path. Thus operating in a partial closed-loop mode for a certain range of signal levels may provide better noise performance than operating in a full closed-loop mode or an open-loop mode.

In some examples the controller 108 may thus be configured to vary the loop gain factor α so as to provide a trade off between distortion/PSSR and feedback path noise so as to improve noise performance.

Additionally or alternatively, the amplifier circuit 300 may be configured so as to reduce a bias applied to at least one component of the feedback path, e.g. the ADC 103, with reducing loop gain factor so as to improve power efficiency. FIG. 7 illustrates that the controller 108 may be configured to control a bias applied to the ADC 103.

As one skilled in the art will understand the noise performance of an ADC 103 may depend on a bias current/voltage applied to one or more components of the ADC 103. Generally, achieving a desired noise performance may require a certain degree of biasing and a lower amount of biasing may result in higher noise. In some implementations, therefore, if the amplifier circuit is operating in a full closed-loop mode, with the loop gain factor α equal to 1, a bias at a first level may be applied so as to achieve a desired noise performance for the ADC 103. If, however, the amplifier circuit operates in a partial closed-loop mode of operation, with a loop gain factor less than 1, the bias applied to ADC 103 may be lower than the first level, so as to reduce power consumption. Whilst applying a lower bias means that the noise in the feedback path may be higher, the reduced loop gain factor may mean that the noise contribution to the forward signal path may not significantly increase.

The controller 108 may be configured to control the loop gain factor based on an indication of signal level, e.g. a signal envelope value, in a similar manner as discussed above. The controller 108 may therefore receive a version of the input signal $S_{IN}$.

In some implementations however the controller may additionally or alternatively control the loop gain factor based on some indication of the extent to which feedback is required. For example, the loop gain factor could be controlled, at least partly, based on an indication $N_{PS}$ of the extent of any noise on the supply voltage $V_H$ and/or $V_L$., e.g. the amount of supply ripple. An indication of the power supply noise $N_{PS}$ could be determined in a variety of ways, as will be understood by one skilled in the art. If there is not much significant supply noise that requires suppressing the loop gain factor may be set relatively low, however if there is a large amount of supply noise the loop gain factor may be high.

In some implementations, the loop gain factor could be based on the error signal ε. The error signal ε indicates the amount of error in the output signal and hence the extent to which feedback is required to compensate. FIG. 7 illustrates the controller 108 could therefore receive the error signal ε.

Embodiments thus relate to amplifier circuits, in particular class-D amplifier circuits that may be operable, in use, to vary a loop gain of a feedback loop of the amplifier circuit. In some embodiment the loop gain may be varied to transition between an open-loop mode of operation and a closed-loop mode of operation. In some embodiments the loop gain may be variable between two or more non-zero values so as to vary the contribution of the feedback in a closed-loop mode of operation. The amplifier circuit may be part of a transducer driving circuit. The amplifier circuit may be part of an audio circuit for amplifying audio signals.

Embodiments may be implemented as an integrated circuit which in some examples could be a codec or similar. Embodiments may be implemented in a host device, especially a portable and/or battery powered host device such as a mobile computing device for example a laptop, notebook or tablet computer, a games console, a remote control device, a home automation controller or a domestic appliance including a domestic temperature or lighting control system, a toy, a machine such as a robot, an audio player, a video player, or a mobile telephone for example a smartphone. The device could be a wearable device such as a smartwatch. It will be understood that embodiments may be implemented as part of a system provided in a home appliance or in a vehicle or interactive display. The amplifier circuit may be an audio amplifier used to drive an audio transducer such as a loudspeaker or surface audio system, but it will be understood that the amplifier may be used to drive other transducers, e.g. a vibrational transducer such as a linear resonant actuator for the generation of haptic effects. There is further provided a host device incorporating the above-described system.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Amplifier circuitry comprising:
    a forward signal path for receiving an input signal and outputting an output signal;
    a feedback path operable to provide a feedback signal derived from the output signal;
    a feedforward path operable to provide a feedforward signal derived from the input signal; and
    a combiner operable to determine an error signal based on a difference between the feedback signal and the feedforward signal;
    wherein the amplifier circuit is selectively operable in a closed-loop mode of operation in which the input signal in the forward signal path is combined with a signal derived from said error signal and an open-loop mode of operation in which the input signal in the forward signal path is not combined with a signal derived from said error signal; and
    wherein the feedforward path comprises a compensation module configured to apply a controlled transfer function to the feedforward signal in the closed-loop mode of operation such that an overall transfer function for the amplifier circuit is substantially the same in the closed-loop mode of operation and the open-loop mode of operation.

2. Amplifier circuitry according to claim 1 wherein the compensation module comprises a filter having a controlled transfer function.

3. Amplifier circuitry according to claim 2 wherein the filter is an adaptive filter.

4. Amplifier circuitry according to claim 1 wherein the compensation module is an adaptive module configured to monitor the error signal to adapt its transfer function in response to the error signal so that the error signal exhibits a desired characteristic over a signal band of interest.

5. Amplifier circuitry according to claim 1 wherein the compensation module is configured to have a transfer function which is matched to a transfer function for the feedback path.

6. Amplifier circuitry according to claim 1 comprising a controller for selectively controlling the amplifier circuit in the open-loop mode of operation or the closed-loop mode of operation.

7. Amplifier circuitry according to claim 6 wherein the controller is configured to selectively transition between the open-loop mode of operation and the closed-loop mode of operation based on an indication of amplitude of the input signal.

8. Amplifier circuitry according to claim 6 wherein the controller is configured to selectively control a loop gain factor, wherein the loop gain factor is equal to zero in the open-loop mode of operation and equal to one in the closed-loop mode of operation, and wherein the amplifier circuit is also operable in at least one additional mode of operation where the loop gain factor is equal to a non-zero value less than one.

9. Amplifier circuitry according to claim 8 wherein the controller is configured to control the loop gain factor based on an indication of power supply noise.

10. Amplifier circuitry according to claim 8 wherein the controller is configured to control the loop gain factor based on the error signal.

11. Amplifier circuitry according to claim 8 wherein the controller is configured to control a bias applied to a component in the feedback path to have a first level in the closed loop mode of operation and a second, lower, level in said additional mode of operation.

12. Amplifier circuitry according to claim 1 comprising a class-D modulator and a class-D output stage in the forward signal path.

13. Amplifier circuitry according to claim 1 comprising a feedback filter in the feedback path.

14. Amplifier circuitry according to claim 13 wherein said feedback filter comprises a low-pass filter.

15. Amplifier circuitry according to claim 1 comprising a loop-filter in an error path for the error signal.

16. Amplifier circuitry according to claim 1 implemented as an integrated circuit.

17. An electronic device comprising amplifier circuitry according to claim 1.

18. A class-D amplifier circuit for receiving an input signal and outputting an output signal, the class-D amplifier circuit comprising a digital modulator and an output stage, wherein the class D amplifier is selectively operable in:
    an open loop mode of operation wherein the input signal as received is provided as an input to the modulator; and
    a closed-loop mode of operation in which the input signal is modified based on an error signal before being provided as an input to the modulator, wherein the error signal is determined based on a difference between a feedback signal derived from the output signal and a feedforward signal derived from the input signal; and
    the class-D amplifier circuit further comprises a compensation module, the compensation module having a transfer function controlled such that an overall transfer function for the class-D amplifier circuit in the closed-loop mode of operation is substantially the same as in the open-loop mode of operation.

\* \* \* \* \*